US006910177B2

(12) United States Patent
Cox

(10) Patent No.: US 6,910,177 B2
(45) Date of Patent: Jun. 21, 2005

(54) VITERBI DECODER USING RESTRUCTURED TRELLIS

(75) Inventor: Darrell K. Cox, Denison, TX (US)

(73) Assignee: Texas Instruments Incorporated, Dallas, TX (US)

( * ) Notice: Subject to any disclaimer, the term of this patent is extended or adjusted under 35 U.S.C. 154(b) by 571 days.

(21) Appl. No.: 10/026,348

(22) Filed: Dec. 21, 2001

(65) Prior Publication Data

US 2003/0120993 A1 Jun. 26, 2003

(51) Int. Cl.[7] .............................................. H03M 13/25
(52) U.S. Cl. ..................... 714/795; 714/786; 714/792
(58) Field of Search ................................ 714/786, 792, 714/795; H03M 13/25

(56) References Cited

U.S. PATENT DOCUMENTS

| | | | | |
|---|---|---|---|---|
| 5,159,610 A | * | 10/1992 | Eyuboglu et al. | 714/792 |
| 5,257,272 A | | 10/1993 | Fredrickson | |
| 5,828,675 A | * | 10/1998 | Chen et al. | 714/795 |
| 6,088,404 A | * | 7/2000 | Jekal | 714/794 |
| 6,333,954 B1 | * | 12/2001 | Hansquine | 714/795 |
| 6,349,117 B1 | * | 2/2002 | Rhee | 714/792 |
| 6,560,749 B1 | * | 5/2003 | Cohen | 714/792 |
| 6,622,283 B1 | * | 9/2003 | Cohen | 714/795 |
| 6,680,980 B1 | * | 1/2004 | Ashley et al. | 714/795 |
| 2001/0033626 A1 | * | 10/2001 | Symes et al. | 714/795 |
| 2001/0037486 A1 | * | 11/2001 | Traeber | 714/795 |
| 2002/0078419 A1 | * | 6/2002 | Kuwazoe et al. | 714/792 |

OTHER PUBLICATIONS

Markarian, G.; Honary, B.; Manukian, H.H.; Signal-to-noise ratio measurement employing trellis decoders; HF Radio Systems and Techniques, 1994., Sixth International Conference on , Jul. 4–7, 1994 pp.: 16–20.*

Hendrix, Henry, "Viterbi Decoding Techniques for the TMS320C54x DSP Generation," Texas Instruments Application Report SPRA071A, Jan. 2002, pp. 1–29.

Taipale, Dana, Implementing Viterbi Decoders Using the VSL Instruction on DSP Families DSP56300 and DSP56600, Motorola Application Report, May 1998, XP002236514, pp. 1–48.

* cited by examiner

Primary Examiner—R. Stephen Dildine
(74) Attorney, Agent, or Firm—Abdul Zindani; W. James Brady, III; Frederick J. Telecky, Jr.

(57) ABSTRACT

Viterbi decoding is implemented using an asymmetrical trellis 70 having an A-trellis 72 and a B-trellis 74. The trellis 70 is designed for efficient implementation on a processing device 40 with arithmetic units 42 having multi-field arithmetic and logic capabilities By concurrently processing multiple path metrics in separate fields, a highly efficient decoder may be implemented in a software-controlled device.

24 Claims, 14 Drawing Sheets

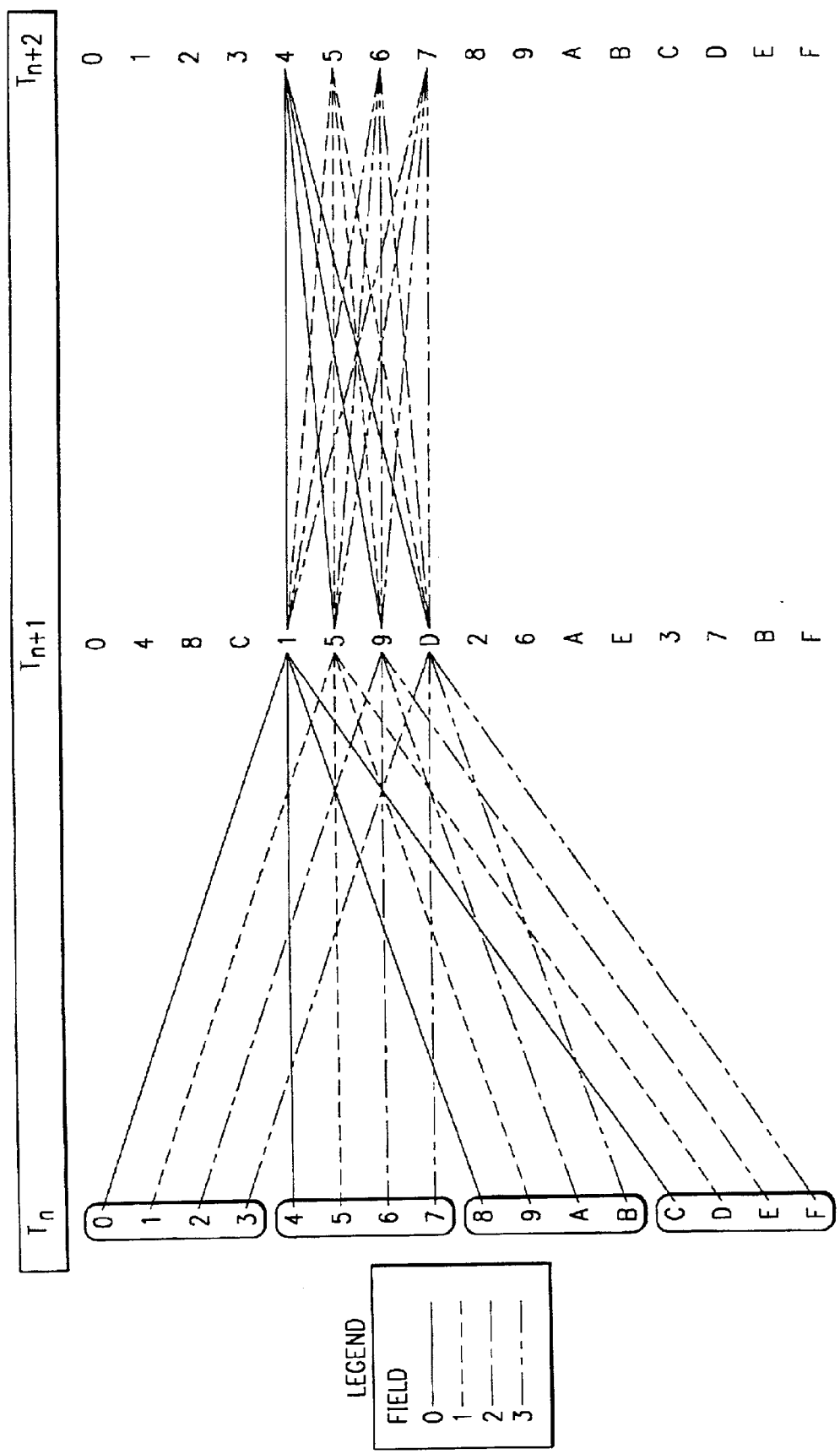

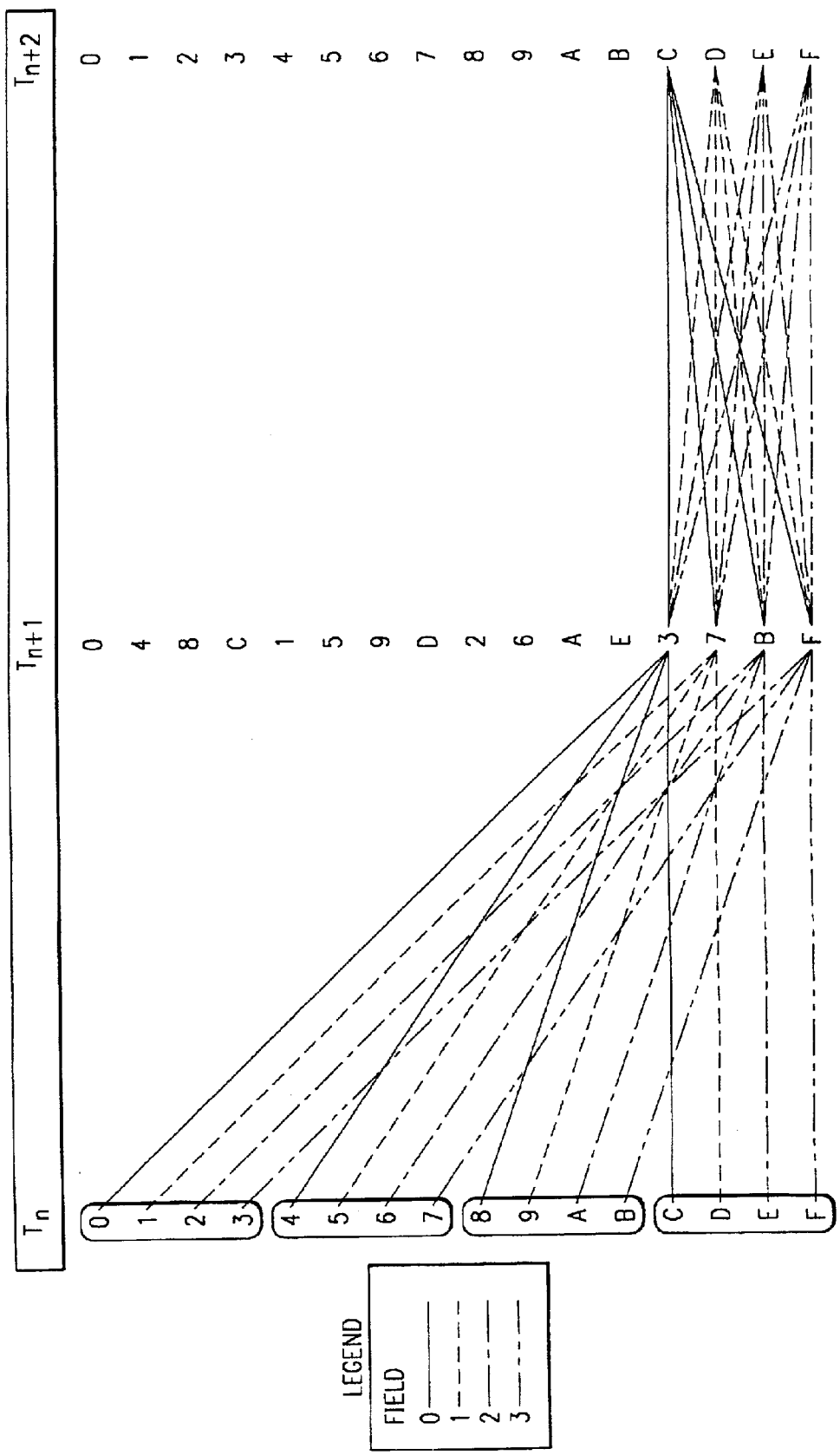

US 6,910,177 B2

VITERBI DECODER USING RESTRUCTURED TRELLIS

CROSS-REFERENCE TO RELATED APPLICATIONS

Not Applicable.

STATEMENT OF FEDERALLY SPONSORED RESEARCH OR DEVELOPMENT

Not Applicable.

BACKGROUND OF THE INVENTION

1. Technical Field

This invention relates in general to electronic communications and, more particularly, to error correction using a Viterbi decoder.

2. Description of the Related Art

Many electronic devices use error correction techniques in conjunction with data transfers between components and/or data storage. Error correction is used in many situations, but is particularly important for wireless data communications, where data can easily be corrupted between the transmitter and the receiver. In some cases, errant data is identified as such and retransmission is requested. Using more robust error correction schemes, however, errant data can be reconstructed without retransmission.

One popular error correction technique uses Viterbi decoding to detect errors in a data stream from a convolution encoder. A Viterbi decoder determines costs associated with multiple possible paths between nodes. After a specified number of stages, the node with the minimum associated cost is chosen, and a path is traced back through the previous stages. The data is decoded data based on the selected path.

Actual implementations of Viterbi decoding use dedicated hardware, because the decoding is computationally intensive. More and more devices, however, are turning to DSPs (digital signal processors) to handle the computational chores. Additional circuitry dedicated to Viterbi decoding on a DSP is undesirable, because it adds to the cost of the DSP and the power consumed by the DSP.

Accordingly, a need has arisen for a method and apparatus for performing Viterbi decoding in software.

BRIEF SUMMARY OF THE INVENTION

The present invention performs a Viterbi decoding function by calculating candidate path metrics for states at time $T_n$ based on previously calculated path metrics for states at time $T_{n-1}$ and branch metrics associated with transitions between the states at time $T_{n-1}$ and states at time $T_n$ according to a first trellis, selecting path metrics for states at time $T_n$ from the candidate path metrics and calculating candidate path metrics for states at $T_{n+1}$ based on the selected path metrics for states at $T_n$ according to a second trellis, different from the first trellis.

Using an asymmetrical trellis structure can provide efficiencies that allow a programmable processing device, such as a digital signal processor, to provide Viterbi decoding at high speeds.

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawings, in which:

FIGS. 10a through 10d are partial trellis diagrams showing Viterbi decoding for respective destination state groups;

DETAILED DESCRIPTION OF THE INVENTION

The present invention is best understood in relation to FIGS. 1–14 of the drawings, like numerals being used for like elements of the various drawings.

Figure 1:
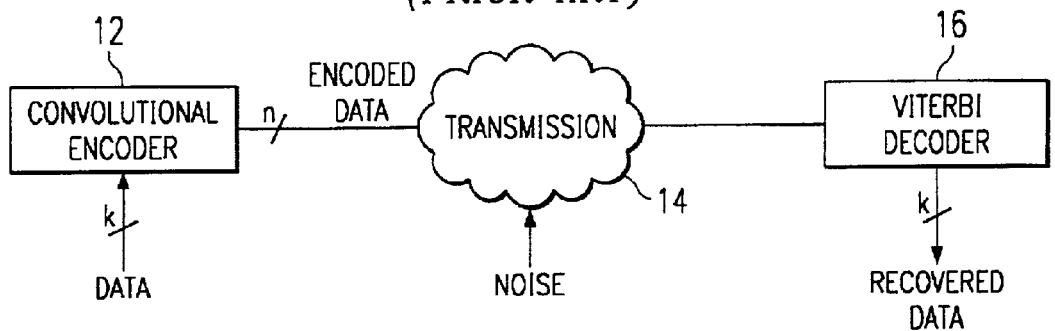
FIG. 1 is a example of a data communication connection used in the prior art.

FIG. 1 illustrates a general block diagram of communications between a data source and destination using convolutional encoding. At the source, k-bit data is received by a convolutional encoder 12. The convolutional encoder 12 generates an n-bit encoded data output based on the received data. The encoded data is transmitted to the destination through a transmission medium 14. During transmission, noise may be added to the encoded data, thereby corrupting some of the output. At the destination, the possibly corrupted data is received by Viterbi decoder 16. The Viterbi decoder recovers the original data; even if the encoded data is corrupted, the Viterbi decoder is able to recover the original data in many situations.

Figure 2:
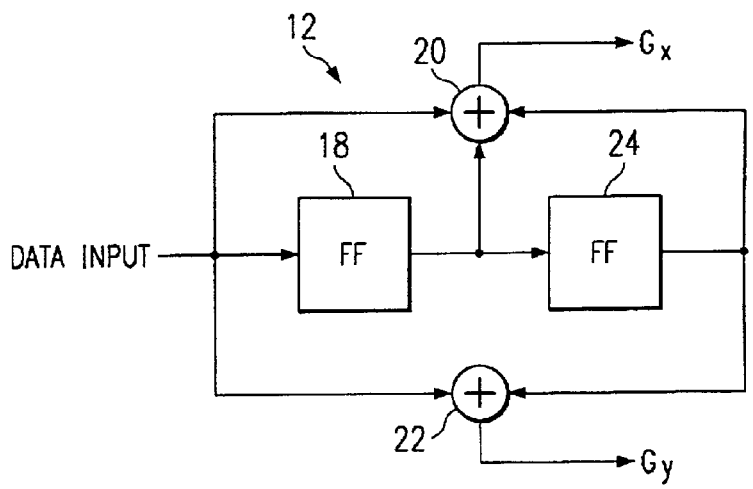
FIG. 2 is a block diagram of a conventional data encoder.

For illustration of convolutional encoding, an example using a k=1, n=2 structure is shown in FIG. 2. The encoder 12 receives the data to be encoded into a flip-flop 18 and two modulo-2 adders 20 and 22. The output of flip-flop 18 is also received by an input of modulo-2 adder 20. The output of flip-flop 18 is also coupled to the input of flip-flop 24. The output of flip-flop 24 is coupled to an input of modulo-2 adder 20 and an input of modulo-2 adder 22. The encoded output XY of the convolution encoder 12 is the output of modulo-2 adder 20 (X) and modulo-2 adder 22 (Y).

The convolutional encoder 12 has a constraint length (K) of 3, meaning that the current output is dependent upon the last three inputs. The dependency on previous values to affect the encoded data output allows the Viterbi decoder to reconstruct the data despite transmission errors. Convolutional decoders are often classified as (n,k,K) encoders;

hence the encoder shown in FIG. 2 would be a (2,1,3) encoder. The connection vectors, which define the connections between the shift register formed by flip-flops 18 and 24, for the encoder shown in FIG. 2 are "111" for modulo-2 adder 20 and "101" for modulo-2 adder 22.

Figure 3:
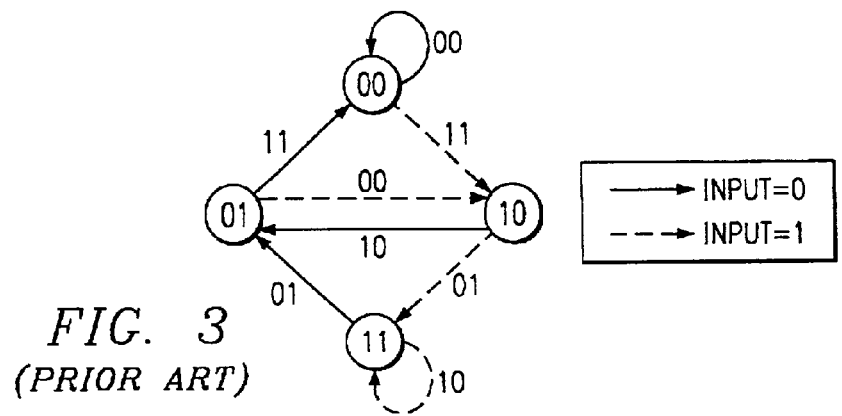
FIG. 3 is a state diagram of the encoder of FIG. 2.

The "state" of the encoder 12 is defined as the outputs of the flip-flops 18 and 24. Thus the state of encoder 12 can be notated as "(output of FF 18, output of FF 24)". A state diagram for the encoder of FIG. 2 is shown in FIG. 3. Each of the four possible states (00, 01, 10 and 11) is shown within a circle. Transitions between states are shown responsive to a data input of "0" (solid line) or a data input of "1" (dashed line). The two-bit value above the transition line is the resulting output XY. Thus, from a state of "00", an input of "0" will result in a return to "00" with an output of "00". An input of 1 will result in a transition to "10" and an output of "11".

Figure 4:
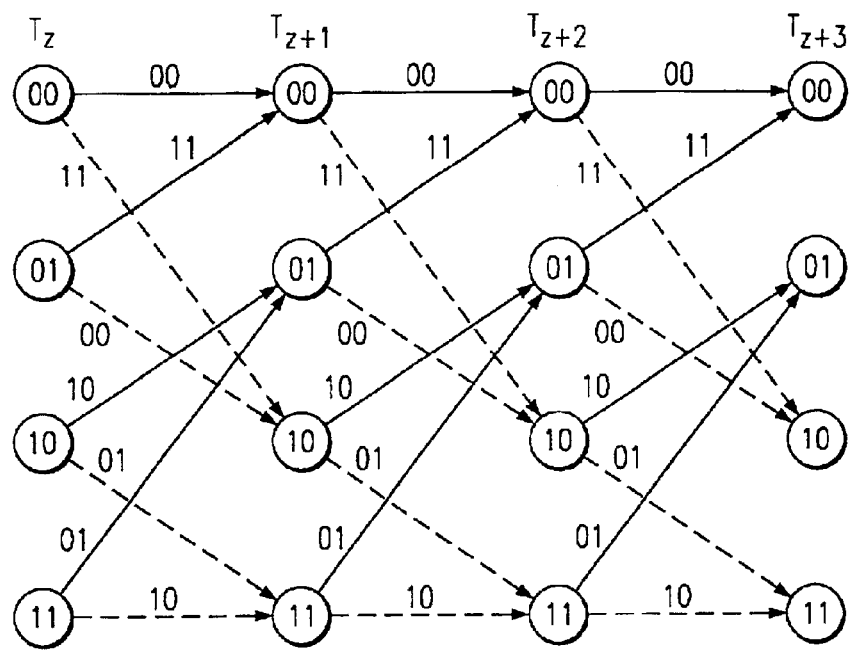
FIG. 4 is a trellis diagram showing data transitions.

The state diagram of FIG. 3 shows the transitions from any state at any given moment. In FIG. 4, a "trellis" diagram is used to shown the transitions over time. From an arbitrary time, $T_z$, the trellis diagram of FIG. 4 shows the possible state transitions and outputs responsive to a given data input.

Figure 5:
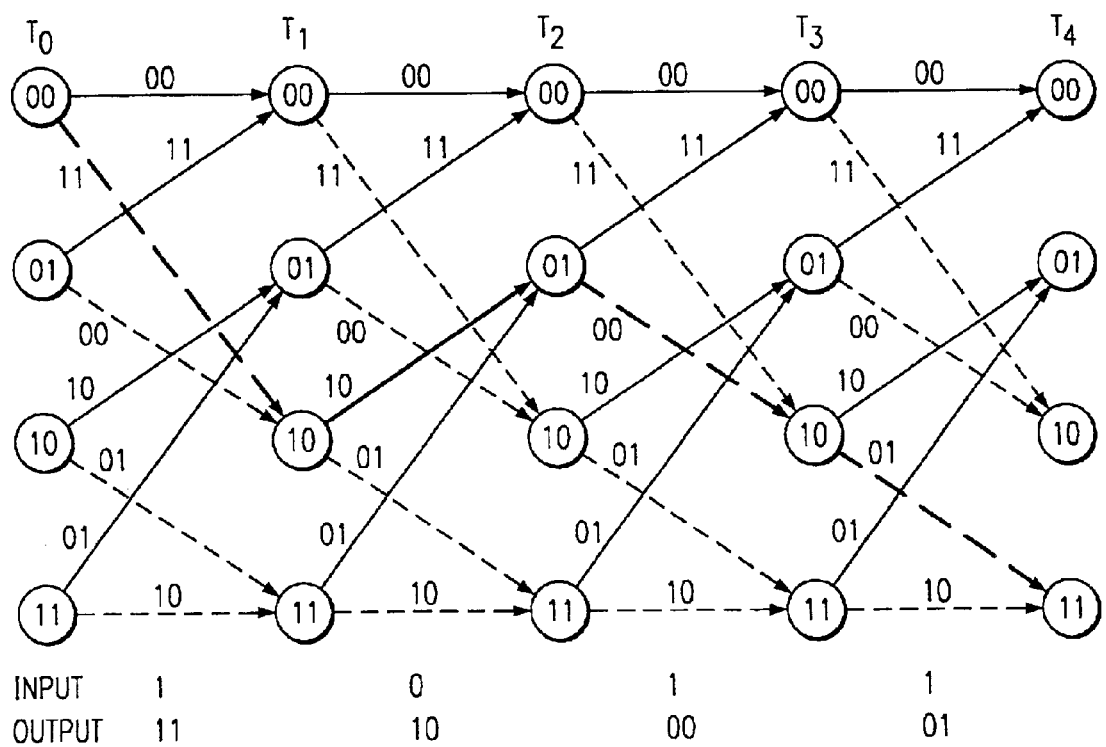
FIG. 5 is a trellis diagram showing the decoding of the data from the encoder of FIG. 2.

FIG. 5 shows an example of a path through the trellis using a data input sequence of "1011" from an initial state of "00". The initial data input "1" causes a transition from state "00" to state "10" and an encoded output of "11". The next data input, "0", causes a transition from state "10" to state "01" and an encoded output of "10". The following data input, "1", causes a transition from state "01" to "10" and an encoded output of "00". The final data input, "1", causes a transition from state "10" to state "11" and an encoded output of "01".

The encoded output "11 10 00 01" will be transmitted to a receiving device with a Viterbi decoder. The two-bit encoded outputs are used to reconstruct the data. By convention, a data transmission begins in state "00". Hence, the first encoded output "11" would signify that the first input data bit was a "1" and the next state was "10". Assuming no errors in transmission, the data input could be determined by state diagram of FIG. 2 or the trellis of FIG. 3.

However, in real-world conditions, the encoded data may be corrupted during transmission. In essence, the Viterbi decoder 16 traces all possible paths, maintaining a "path metric" for each path, which accumulates differences ("branch metrics") between the each of the encoded outputs actually received and the encoded outputs that would be expected for that path. The path with the lowest path metric is the maximum likelihood path.

Figure 6A:
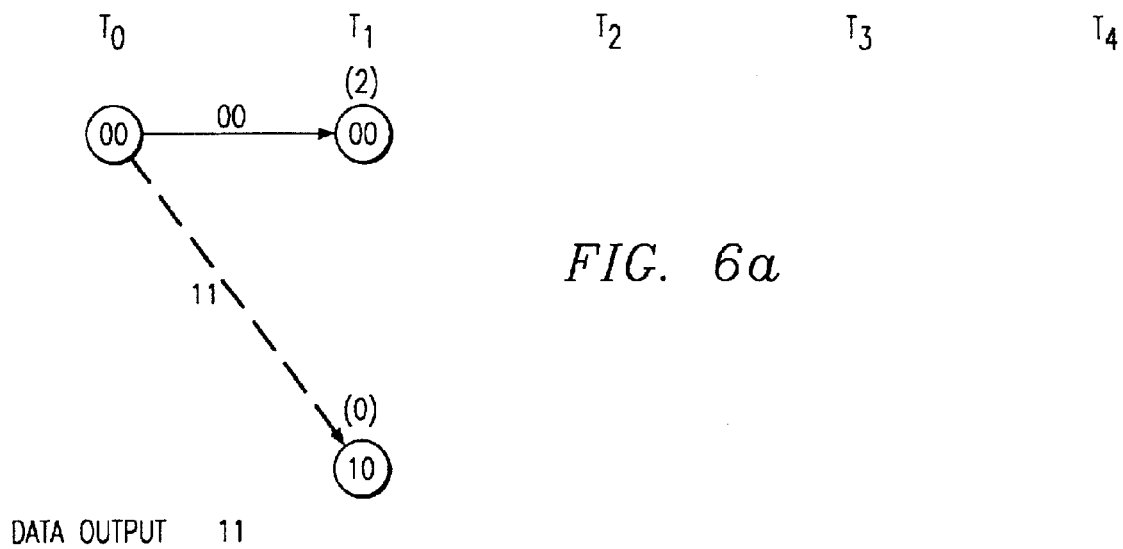
FIGS. 6a through 6d are trellis diagrams showing the calculation of path metrics through the trellis diagram.

FIG. 6a illustrates computation of the branch metrics for the transition from the initial state of "00". In this case, an "11" was received. With two-bit outputs, a "Hamming distance" may be used to calculate the branch metric. The Hamming distance is the sum of exclusive or operation on respective bits of the received output and the expected output. For the path assuming a "0" input, the branch metric between the received encoded output ("11") and the expected encoded output ("00") is two. For the path assuming a "1" input, the branch metric between the received encoded output ("11") and the expected encoded output ("00") is zero. Hence the path metric at state "00" at time $T_1$ is two and the path metric at state "10" at time $T_1$ is zero. The path metrics are shown above the states in the diagram.

Figure 6B:
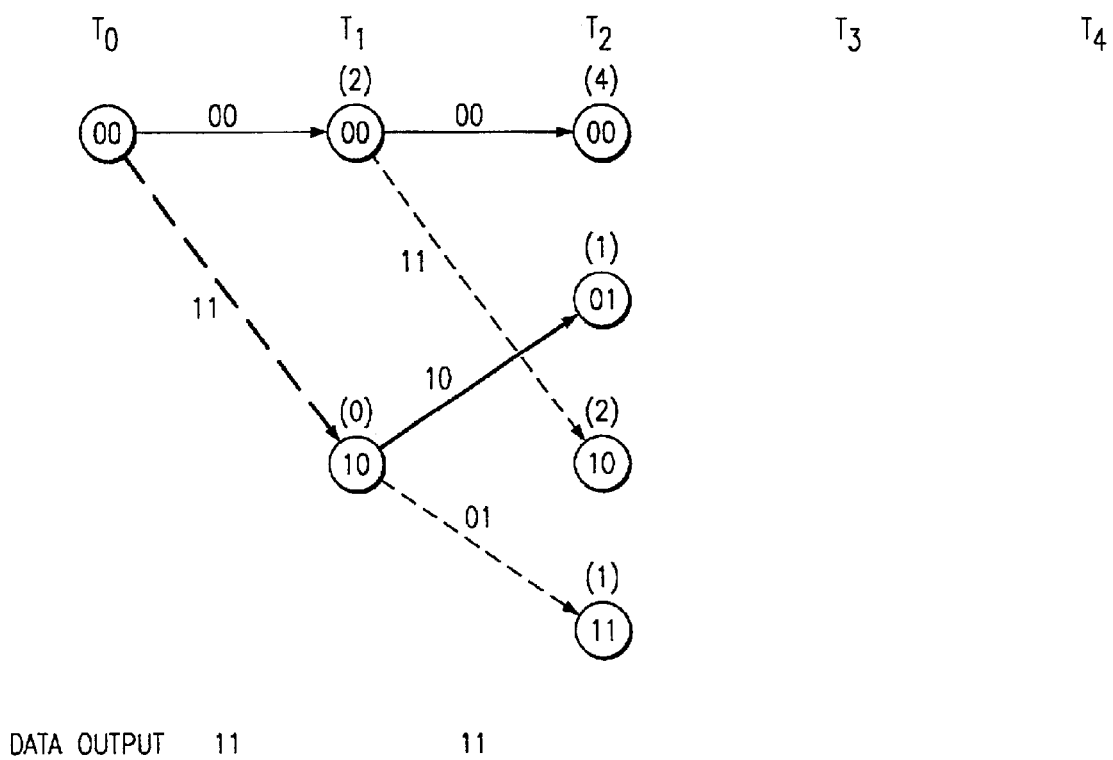

FIG. 6b illustrates the path through time $T_2$. In this example, it is assumed that there is a data transmission error, and the received encoded output is "11" rather than "10".

Hence, at $T_2$, the path metric is four for state "00", one for state "01", two for state "10" and one for state "11".

Figure 6C:
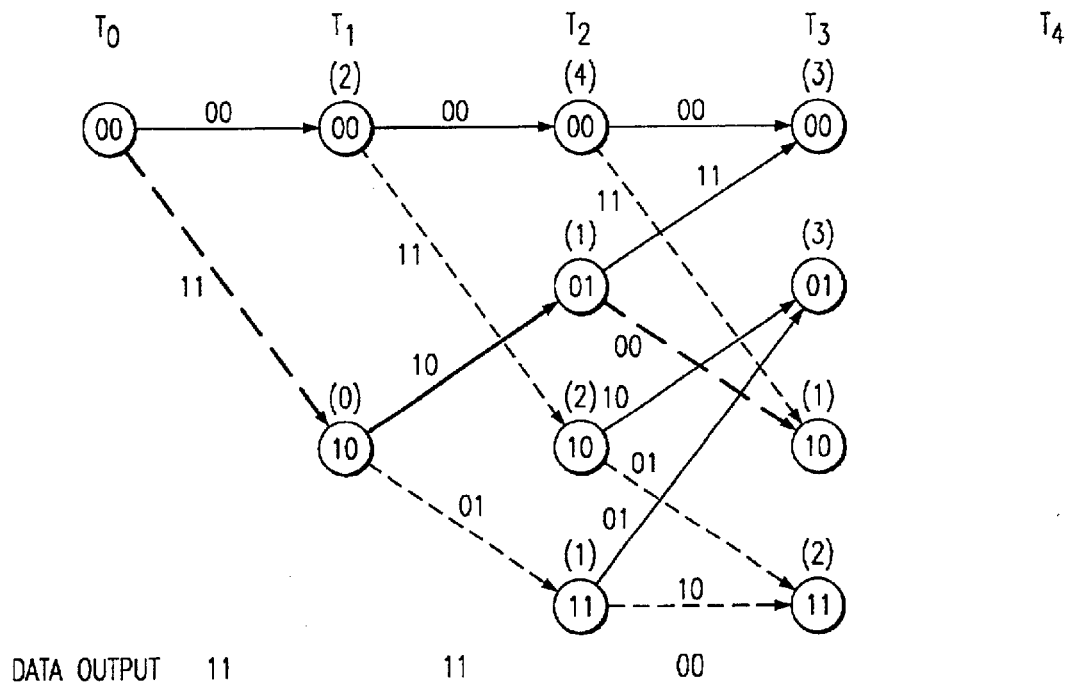

FIG. 6c illustrates the path through time $T_3$. At this point, two potential paths are entering each state, For each state, the branch metric is computed for each path entering the state, and the path with the lowest path metric is chosen (the "surviving path"). If two paths have the same path metric (such as state "01" at $T_3$), a path can be chosen randomly or deterministically (such as by always choosing the upper path).

Figure 6D:
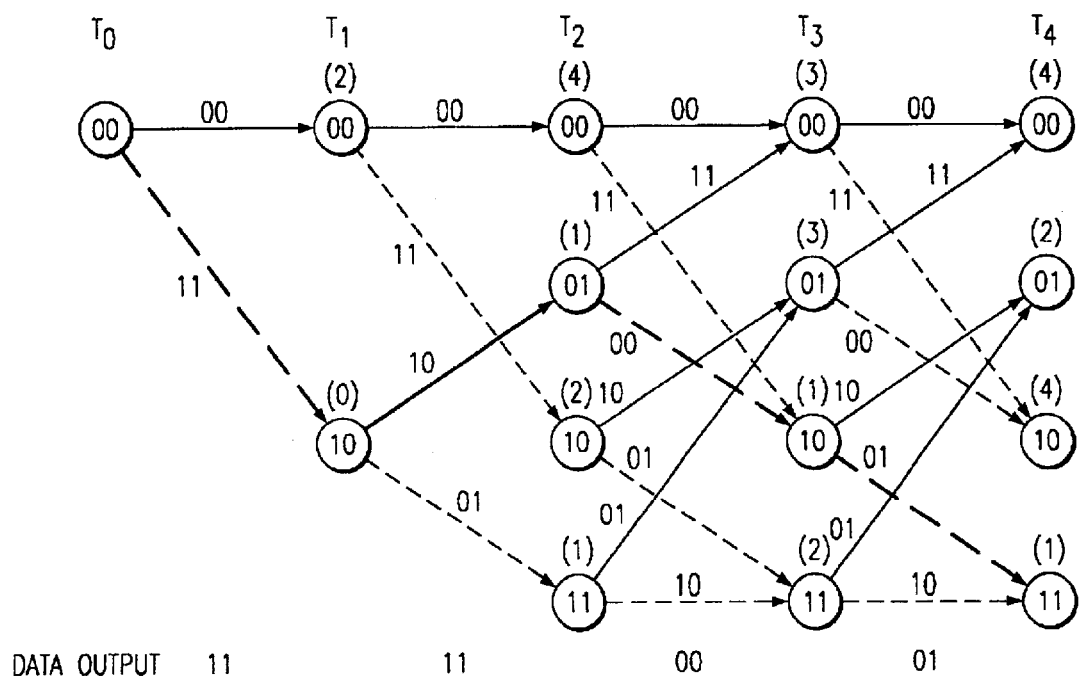

FIG. 6d shows the path through time $T_4$. At this point, the actual path through states "10 01 10 11" has the lowest path metric. If the example sequence were longer, the path metrics for all other paths would increase as the path metric for the actual path remained the same (assuming no additional errors). When the end of a path is reached, the most likely path is determined through a process called "traceback".

As can be seen in FIGS. 6a–d, for each time period, a branch metric calculation and path metric calculation must be performed for each path entering a state. Further, a comparison must be performed to determine the surviving state. For the example shown in FIGS. 2–6, this is not terribly computation intensive. But for larger trellis structures, for example a radix-4 trellis, the computations involved may necessitate a dedicated hardware decoder, rather than a software Viterbi decoder.

The present invention is described in conjunction with a 16-state Viterbi decoder. The method of performing the decoding the encoded information using software uses a programmable processing device, such as the C60 series of digital signal processors from TEXAS INSTRUMENTS INCORPORATED. A simplified block diagram showing the pertinent features of such a processing device is shown in FIG. 7.

In the preferred embodiment, the processing device 40 includes one or more arithmetic units 42 capable of multiple field arithmetic and a plurality of registers 44, typically arranged in a register file 46. The arithmetic units 42 have the ability to perform separate logical and arithmetic operations on predefined fields 48 within their input registers 50 under program control (represented by control logic 51). For example, if an arithmetic unit 42 uses 32-bit input registers, it could perform four simultaneous compares between four respective eight-bit fields 48 within the input registers 50. The method described herein takes advantage of the simultaneous operations in order to efficiently process information such that a software Viterbi decoding operation can be performed at a suitable speed.

Figure 8:
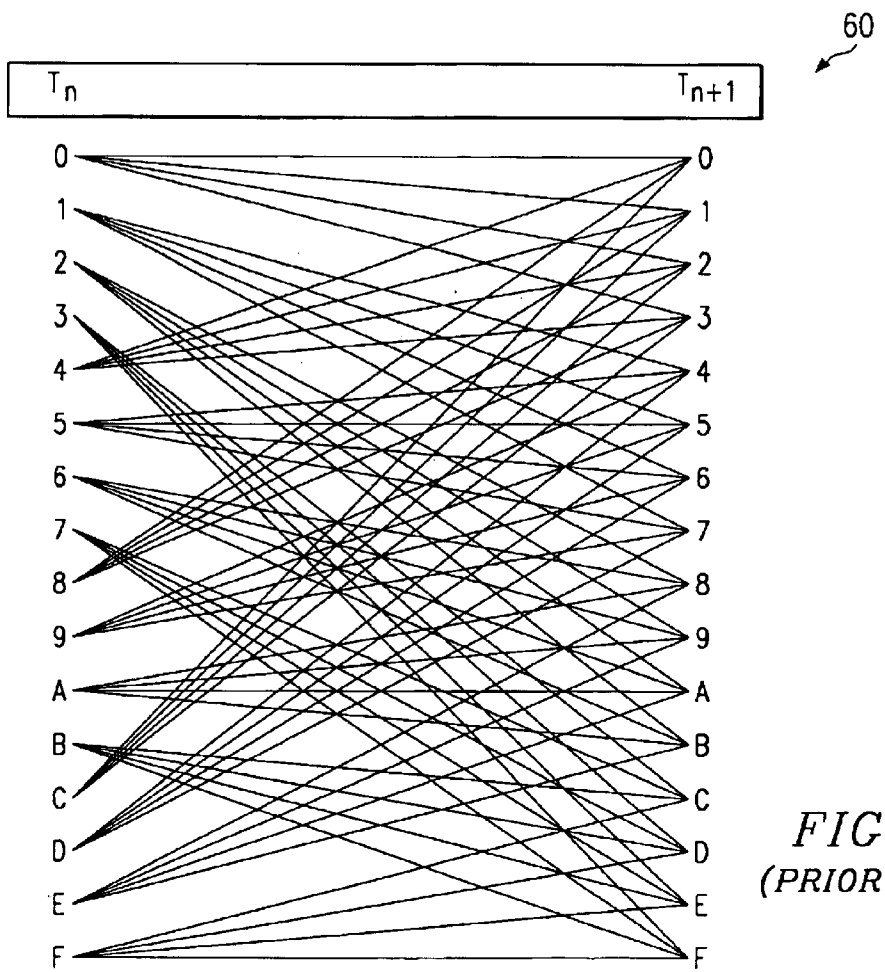
FIG. 8 is a prior art trellis diagram for a 16-state Viterbi decoder.

FIG. 8 illustrates a prior art sixteen state Viterbi decoding stage 60. The sixteen states are notated in hexadecimal format as states 0-F. As shown in FIG. 5, this same stage is used between consecutive time periods ($T_n$, $T_{n+1}$) throughout the decoder. However, the computation involved in using this type of decoder stage is too complex to accommodate a typical data rate using a software programmable device.

Figure 7:
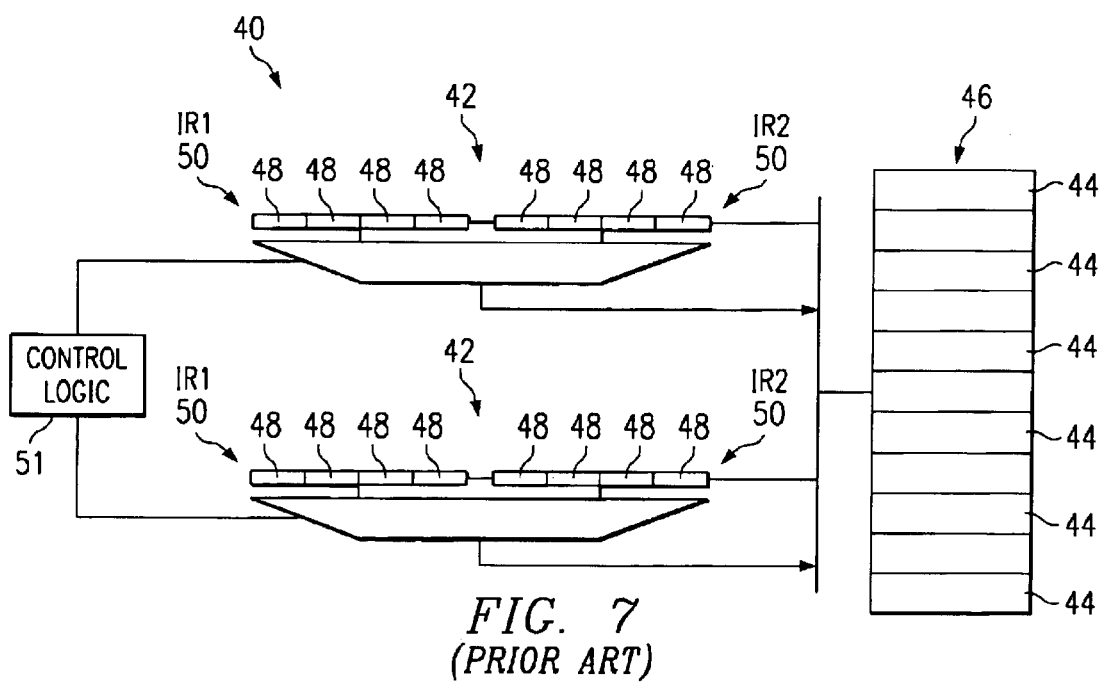
FIG. 7 is a block diagram of a programmable processing device capable of multi-field arithmetic and logic operations.
Figure 9:
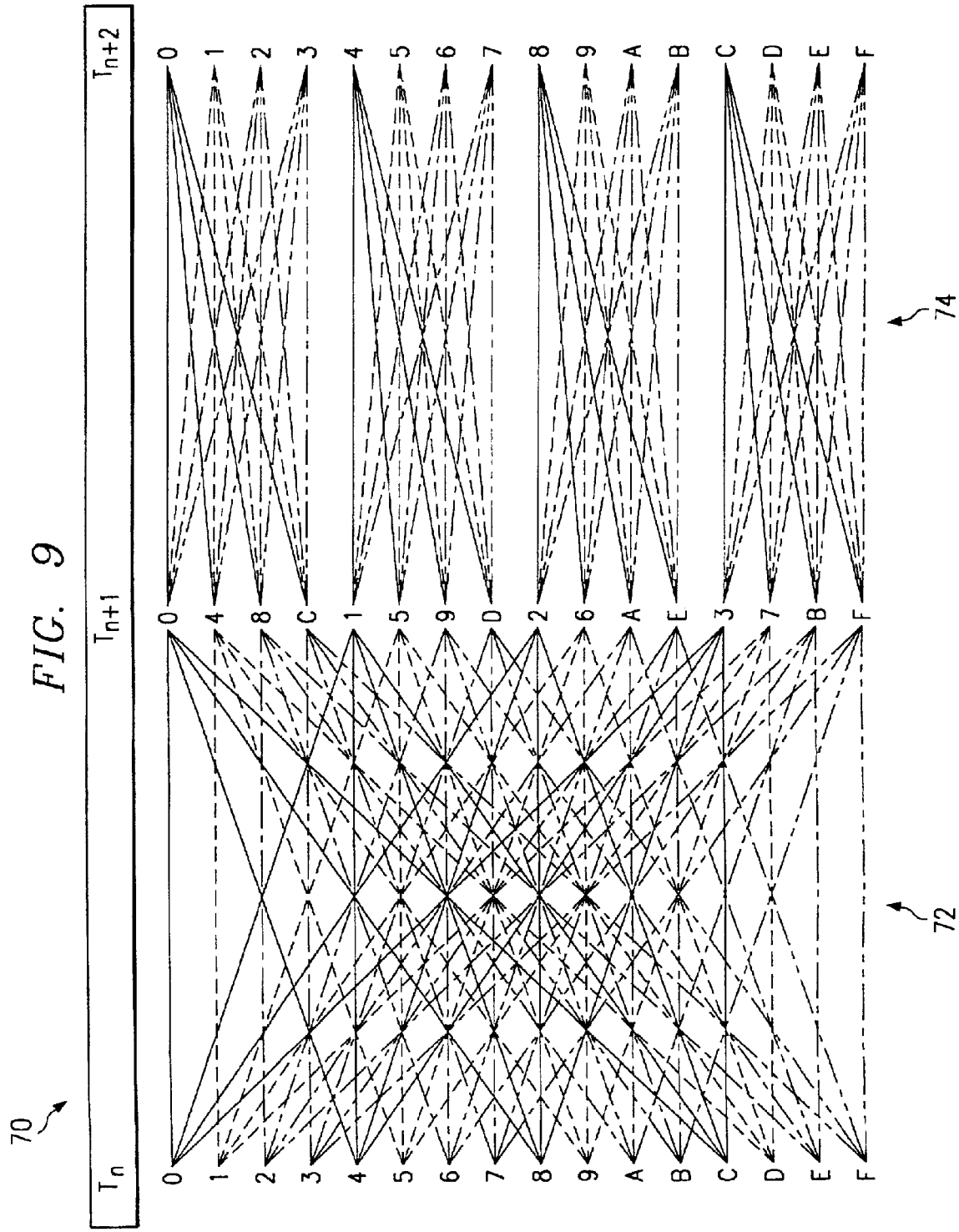
FIG. 9 is an asymmetrical trellis pair used in conjunction with the processing device of FIG. 7.

FIG. 9 illustrates an asymmetrical Viterbi decoding stage pair 70 that increases the efficiency of computation when used with a processing device of the type shown in FIG. 7. The decoding stage pair is "asymmetrical" because consecutive stages use different operations to perform the path metric calculations. For reference, the pair includes "A-trellis" 72 and "B-trellis" 74.

FIGS. 10a–d illustrate partial trellis diagrams showing how path metrics are concurrently calculated at four destination states. For example, referring to FIG. 10a, at $T_{n+1}$, new path metrics for states 0, 4, 8 and C are concurrently calculated. Similarly, at $T_{n+2}$, new path metrics for states 0, 1, 2, and 3 are concurrently calculated from the results of staes 0, 4, 8 and C at $T_{n+1}$. The lines indicate which fields are used for the calculations of the new path metrics; the particular fields used could be different depending upon the implementation.

Figure 10A:
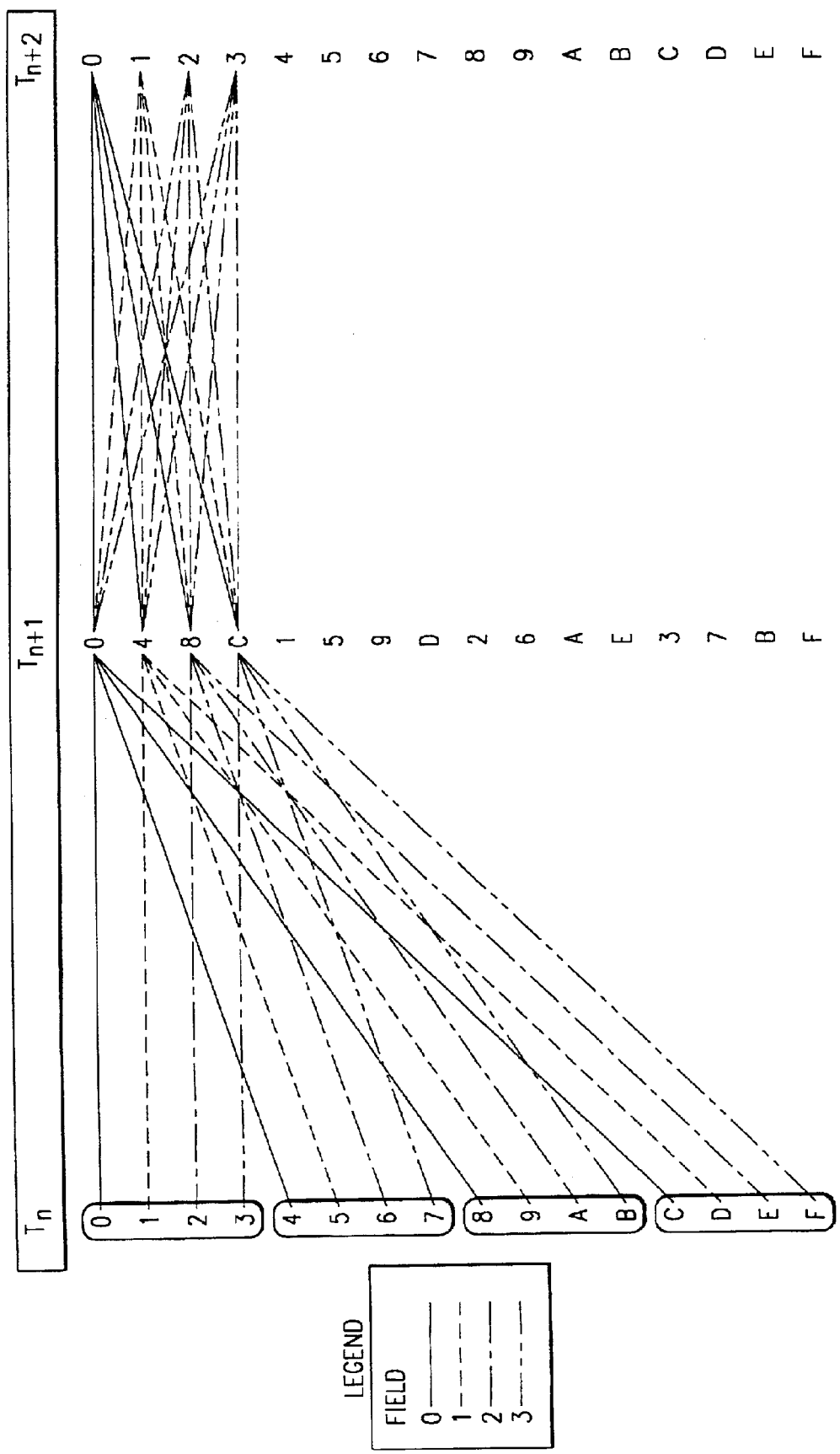
Figure 10C:
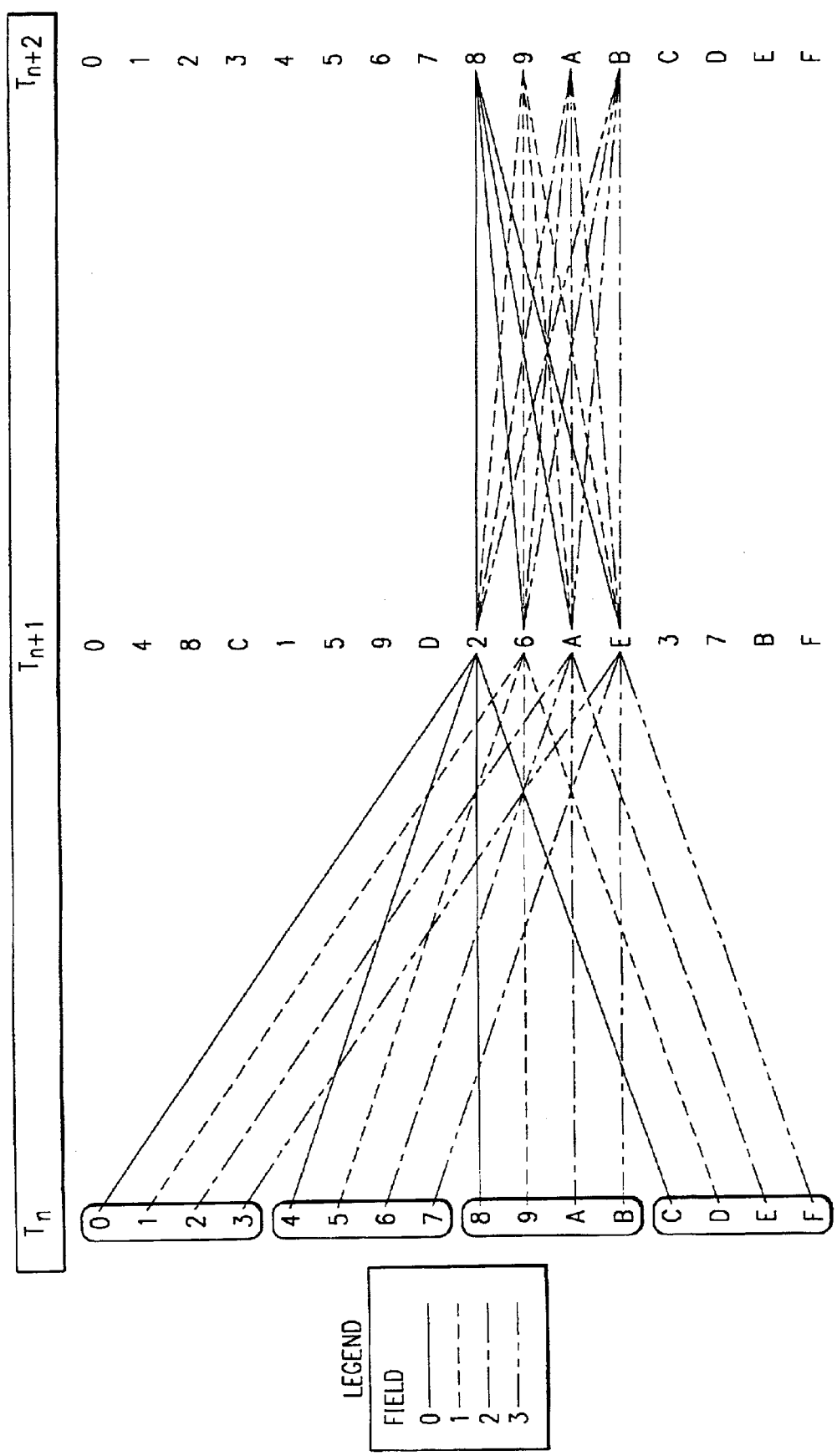

Recapping the discussion of four-state Viterbi decoders, it can be seen from FIG. 10a that the path metric for state 0 at $T_{n+1}$ is equal to the lowest of the sum of the path metrics at states 0, 4, 8 and C at $T_n$ added to the respective branch metric between those states and state 0 at $T_{n+1}$. To accurately describe the relationships, P(s,t) equals the path metric of state s at time t and $B(s_1,s_2)$ is the branch metric between state $s_1$ and $s_2$ based on the received encoded data. Hence:

P(0,$T_{n+1}$) equals min[P(0,$T_n$)+B(0,0), P(4,$T_n$)+B(4,0), P(8,$T_n$)+B(8,0), P(C,$T_n$)+B(C,0)]

P(4,$T_{n+1}$) equals min[P(1,$T_n$)+B (1,4), P(5,$T_n$)+B(5,4), P(9,$T_n$)+B(9,4), P(D,$T_n$)+B(D,4)]

P(8,$T_{n+1}$) equals min[P(2,$T_n$)+B(2,8), P(6,$T_n$)+B(6,8), P(A,$T_n$)+B(A,8), P(E,$T_n$)+B (E,8)]

P(C,$T_{n+1}$) equals min[P(3,$T_n$)+B(3,C), P(7,$T_n$)+B(7,C), P(B,$T_n$)+B(C,C), P(F,$T_n$)+B(F,C)]

Figure 11:
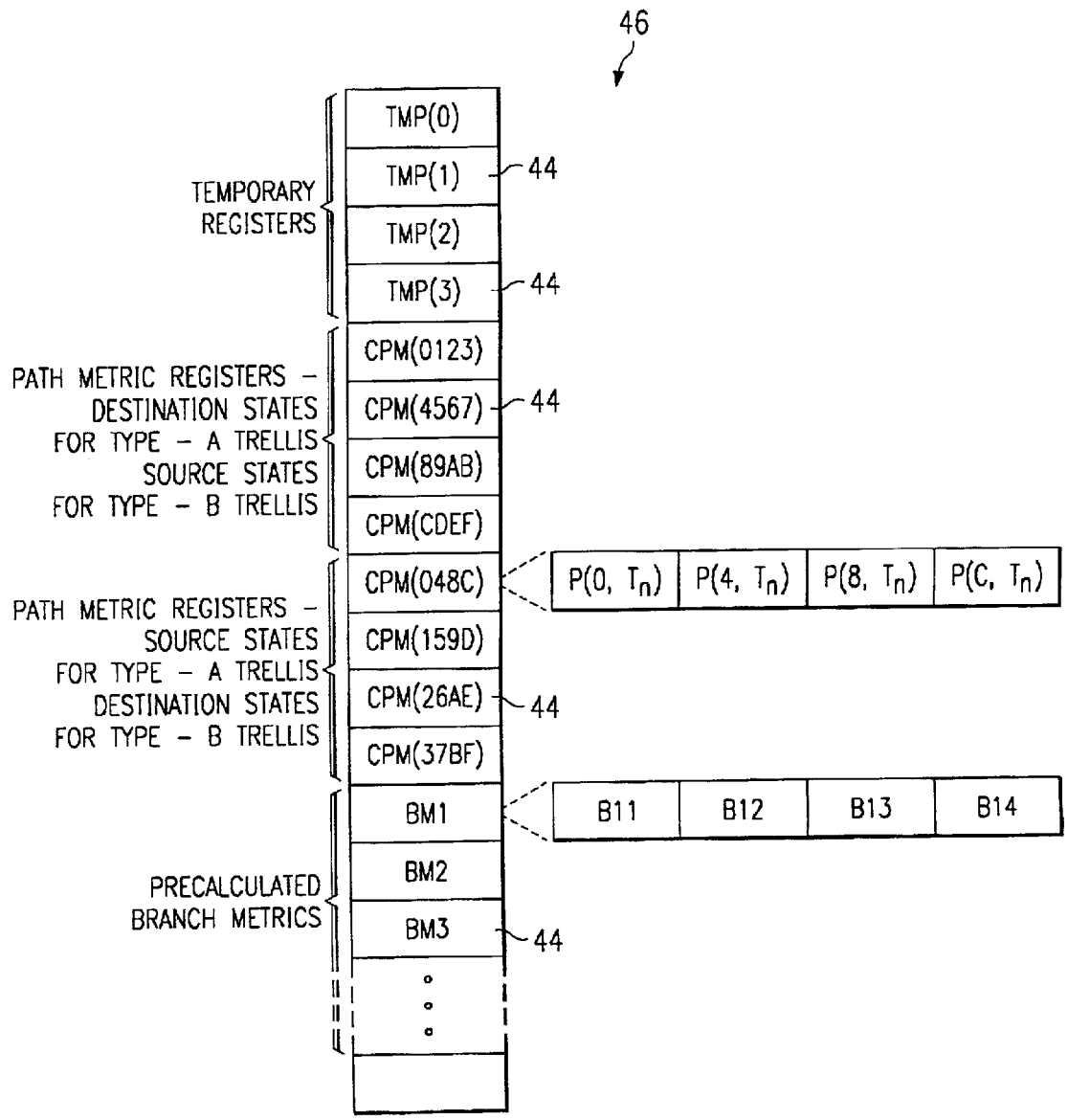
FIG. 11 illustrates various registers used in the implementation of the Viterbi decoder.

The operations for FIG. 10a–d will be discussed with reference to FIGS. 11, 12 and 13. FIG. 11 shows an example of a register file allocation. Four registers are used as temporary registers, TMP(0..3). These registers are used for intermediate calculations. Eight registers are used for storing path metrics. Each of these registers holds path metric values for four states in respective fields. For example, the register storing CPM(048C) stores path metric at states 0, 4, 8 and C. Of these eight, four registers are used to store the path metric calculated by the A-trellis 72 and four registers are used to store the path metrics calculated by the B-trellis 74. The registers used to store the path metrics for the A-trellis 72 are used as the most recently calculated path metrics for the calculations performed by the B-trellis 74. Likewise, the registers used to store the path metrics for the B-trellis 74 are used as the most recently calculated path metrics for the calculations performed by the A-trellis 72.

Additionally, a number of registers storing branch metrics for the path metric calculations are provided Because the branch metrics will depend upon the encoding scheme, their calculation will not be specified. No matter what method is used for calculating branch metrics, it should be possible to pre-calculate the branch metrics (as the data is received) for efficient calculation of the candidate path metrics.

Figure 12:
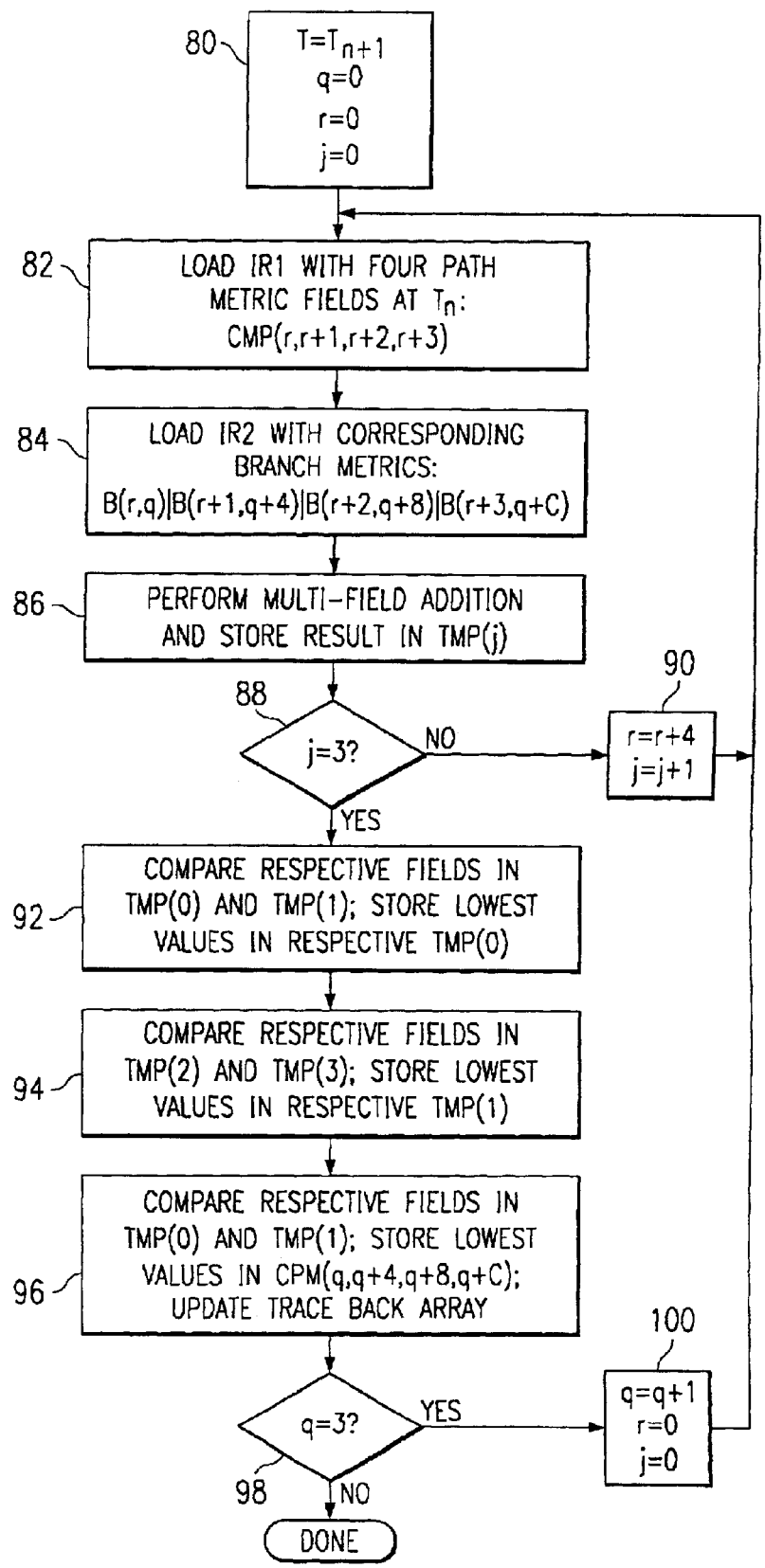
FIG. 12 illustrates a flow chart describing implementation of the first trellis of the trellis pair.

FIG. 12 illustrates a flow chart describing the calculations using the A-trellis 72. It should be noted that this flowchart is meant to describe the various calculations being made to implement the A-trellis and is not a detailed description of a particular order. Multiple arithmetic units, some steps can be performed concurrently for the greatest time efficiency. For clarity, the line between states (representing the path metric) in the Figures illustrating the trellises is depicted according to the field in the four-field word which stores the intermediate result according to the following legend:

In block 80, variables q, r, and j are set to zero. For purposes of reference, the current time is $T_{n+1}$. These variables are used as indices for various registers and states. In block 82, one input (IR1) is loaded with a path metric from the register file 46. On the first pass, therefore, CMP (0123) (see FIG. 11) is loaded into IR1. This register holds the path metrics computed for states 0, 4, 8 and C at $T_n$.

In block 84, the other input is loaded with branch metrics based on the current data value, the source state and the destination state. There are four branch metrics in four fields. For the first pass, the branch metrics B(0,0), B(1,4), B(2,8) and B(3,C) are loaded. It is assumed that the branch metrics have been previously computed and packed into four-field words and stored in the register file 46.

A multi-field addition is performed in step 86, where the first field from IR1 is added to the first field in IR2, the second field in IR1 is added to the second field in IR2, and so on. The result is stored in a temporary file TMP(j). Hence on the first pass, the result will be stored in TMP(0). Accordingly, at the end of the first pass (j=0), TMP(0) will store the candidate path metrics associated with a transition from state 0 (at $T_n$) to state 0 (at $T_{n+1}$), state 1 (at $T_n$) to state 4 (at $T_{n+1}$), state 2 (at $T_n$) to state 8 (at $T_{n-1}$), and state 3 (at $T_n$) to state C (at $T_{n+1}$).

On each pass (i.e., for each increment of j in blocks 88 and 90), a new set of source states and branch metrics are used to calculate additional candidate path metrics. Thus, on the second pass (j=1), TMP(1) stores the candidate path metrics associated with a transition from state 4 (at $T_n$) to state 0 (at $T_{n+1}$), state 5 (at $T_n$) to state 4 (at $T_{n+1}$), state 6 (at $T_n$) to state 8 (at $T_{n+1}$), and state 7 (at $T_n$) to state C (at $T_{n+1}$). On subsequent passes, TMP(2) stores the candidate path metrics associated with a transition from state 8 (at $T_n$) to state 0 (at $T_{n+1}$), state 9 (at $T_n$) to state 4 (at $T_{n+1}$), state A (at $T_n$) to state 8 (at $T_{n+1}$), and state B (at $T_n$) to state C (at $T_{n+1}$). TMP(3) stores the candidate path metrics associated with a transition from state C (at $T_n$) to state 0 (at $T_{n+1}$), state D (at $T_n$) to state 4 (at $T_{n+1}$), state E (at $T_n$) to state 8 (at $T_{n+1}$), and state F (at $T_n$) to state C (at $T_{n+1}$).

TABLE 1

Content of TMP Registers After First Group

| | State 0 | State 4 | State 8 | State C |
|---|---|---|---|---|
| TMP(0) | P(0,$T_n$) + B(0,0) | P(1,$T_n$) + B(1,4) | P(2,$T_n$) + B(2,8) | P(3,$T_n$) + B(3,C) |
| TMP(1) | P(4,$T_n$) + B(4,0) | P(5,$T_n$) + B(5,4) | P(6,$T_n$) + B(6,8) | P(7,$T_n$) + B(7,C) |
| TMP(2) | P(8,$T_n$) + B(8,0) | P(9,$T_n$) + B(9,4) | P(A,$T_n$) + B(A,8) | P(B,$T_n$) + B(C,C) |
| TMP(3) | P(C,$T_n$) + B(C,0) | P(D,$T_n$) + B(D,4) | P(E,$T_n$) + B(E,8) | P(F,$T_n$) + B(F,C) |

For the first group of destination states (0,4,8,C), when j=3 in block 88, the four temporary registers TMP(0..3) hold, in respective fields, the candidate path metrics of the four possible transitions to states 0, 4, 8 and C, as shown in Table 1. In block 92, the respective fields of TMP(0) and TMP(1) are compared and the paths with the lowest path metric for each field are selected and stored back in TMP(0). In block 94, the respective fields of TMP(2) and TMP(3) are compared and the paths with the lowest path metric for each field are selected and stored in TMP(1). Finally, in block 96, TMP(0) and TMP(1) are compared and the lowest path metric for each field is stored in the appropriate register associate with the states being evaluated. For the A-Trellis of FIG. 10a, this would be CMP(048C).

In blocks 98 and 100, the same flow as described above is used to determine the lowest cost path for states associated with CMP(159D), CMP(26AE), and CMP(37BF). The contents of the TMP registers prior to the comparisons are illustrated below in Tables 2–4.

TABLE 2

Content of TMP Registers After Second Group

|  | State 1 | State 5 | State 9 | State D |
|---|---|---|---|---|
| TMP(0) | $P(0,T_n)$ + $B(0,1)$ | $P(1,T_n)$ + $B(1,5)$ | $P(2,T_n)$ + $B(2,9)$ | $P(3,T_n)$ + $B(3,D)$ |
| TMP(1) | $P(4,T_n)$ + $B(4,1)$ | $P(5,T_n)$ + $B(5,5)$ | $P(6,T_n)$ + $B(6,9)$ | $P(7,T_n)$ + $B(7,D)$ |
| TMP(2) | $P(8,T_n)$ + $B(8,1)$ | $P(9,T_n)$ + $B(9,5)$ | $P(A,T_n)$ + $B(A,9)$ | $P(B,T_n)$ + $B(C,D)$ |
| TMP(3) | $P(C,T_n)$ + $B(C,1)$ | $P(D,T_n)$ + $B(D,5)$ | $P(E,T_n)$ + $B(E,9)$ | $P(F,T_n)$ + $B(F,D)$ |

TABLE 3

Content of TMP Registers After Third Group

|  | State 2 | State 6 | State A | State E |
|---|---|---|---|---|
| TMP(0) | $P(0,T_n)$ + $B(0,2)$ | $P(1,T_n)$ + $B(1,6)$ | $P(2,T_n)$ + $B(2,A)$ | $P(3,T_n)$ + $B(3,E)$ |
| TMP(1) | $P(4,T_n)$ + $B(4,2)$ | $P(5,T_n)$ + $B(5,6)$ | $P(6,T_n)$ + $B(6,A)$ | $P(7,T_n)$ + $B(7,E)$ |
| TMP(2) | $P(8,T_n)$ + $B(8,2)$ | $P(9,T_n)$ + $B(9,6)$ | $P(A,T_n)$ + $B(A,A)$ | $P(B,T_n)$ + $B(C,E)$ |
| TMP(3) | $P(C,T_n)$ + $B(C,2)$ | $P(D,T_n)$ + $B(D,6)$ | $P(E,T_n)$ + $B(E,A)$ | $P(F,T_n)$ + $B(F,E)$ |

TABLE 4

Content of TMP Registers After Fourth Group

|  | State 3 | State 7 | State B | State F |
|---|---|---|---|---|
| TMP(0) | $P(0,T_n)$ + $B(0,3)$ | $P(1,T_n)$ + $B(1,7)$ | $P(2,T_n)$ + $B(2,B)$ | $P(3,T_n)$ + $B(3,F)$ |
| TMP(1) | $P(4,T_n)$ + $B(4,3)$ | $P(5,T_n)$ + $B(5,7)$ | $P(6,T_n)$ + $B(6,B)$ | $P(7,T_n)$ + $B(7,F)$ |
| TMP(2) | $P(8,T_n)$ + $B(8,3)$ | $P(9,T_n)$ + $B(9,7)$ | $P(A,T_n)$ + $B(A,B)$ | $P(B,T_n)$ + $B(C,F)$ |
| TMP(3) | $P(C,T_n)$ + $B(C,3)$ | $P(D,T_n)$ + $B(D,7)$ | $P(E,T_n)$ + $B(E,B)$ | $P(F,T_n)$ + $B(F,F)$ |

The operation of the processing device 40 to implement the B-Trellis 74 is somewhat different. As shown in FIG. 10*a*, the first group of destination registers for this trellis includes states 0, 1, 2 and 3. The computation of the candidate path metrics for these groups is based on a single set of four source states: states 0, 4, 8, and C (the destination states for the preceding A-Trellis 72). The preferred implementation of this trellis rotates the contents of the registers computed in the previous A-Trellis 72 to derive the four candidate path metrics for each destination state.

Figure 13:
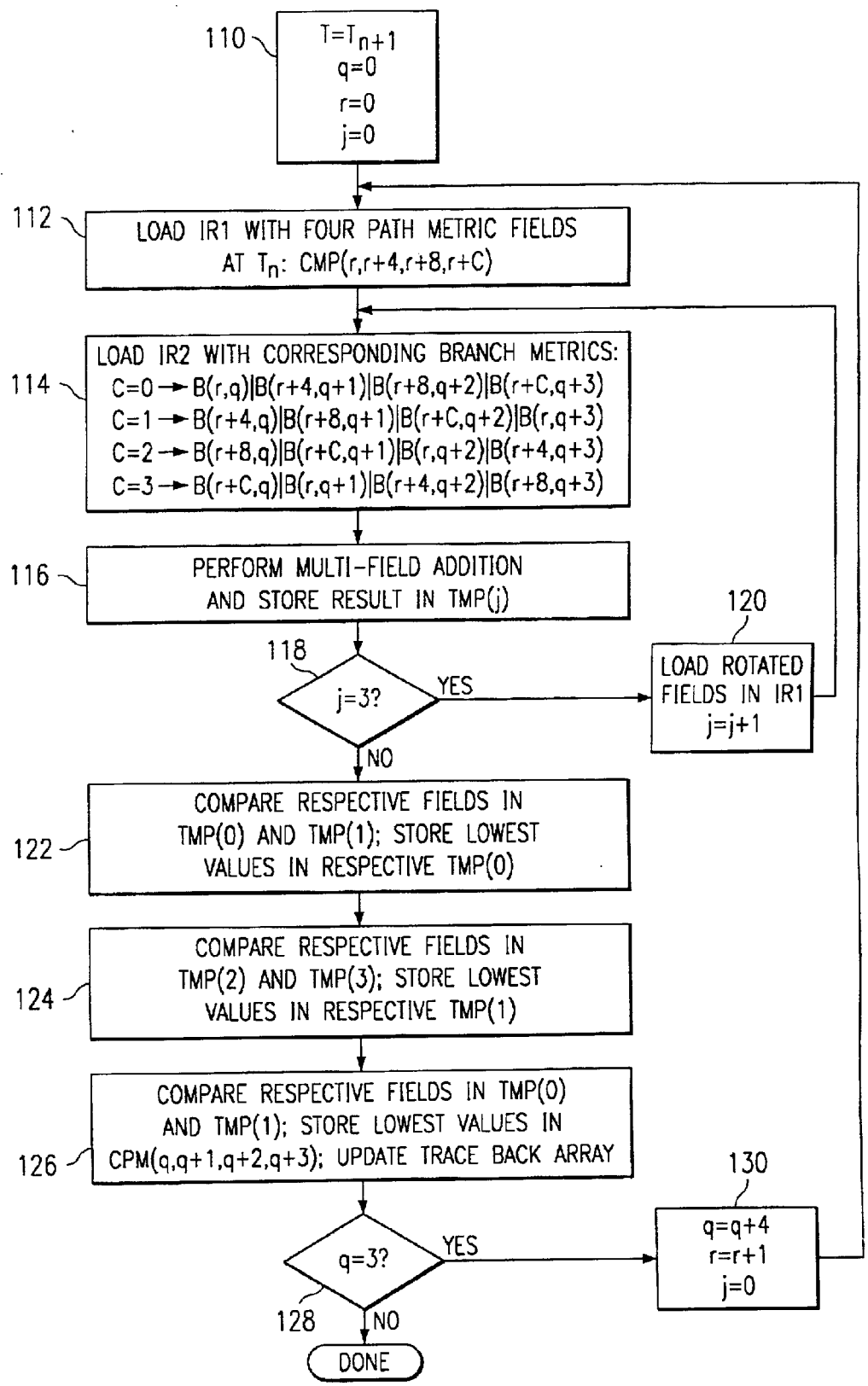
FIG. 13 illustrates a flow chart describing implementation of the second trellis of the trellis pair.
Figure 14A:
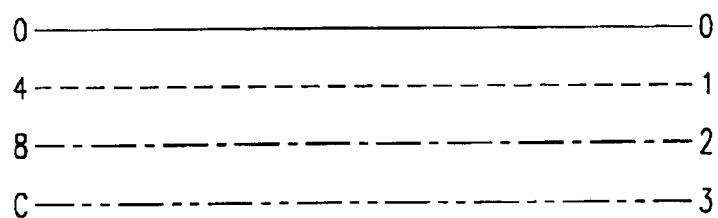
FIG. 14a through FIG. 14d illustrate partial trellis diagrams for a first destination state group the second trellis over respective passes.
Figure 14B:
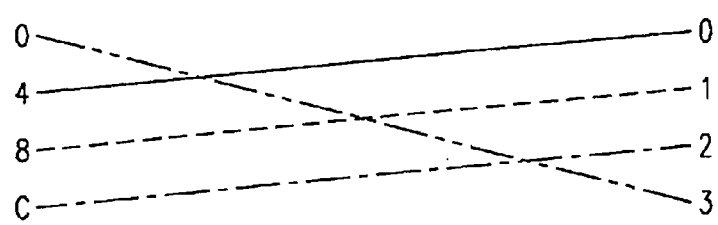
Figure 14C:
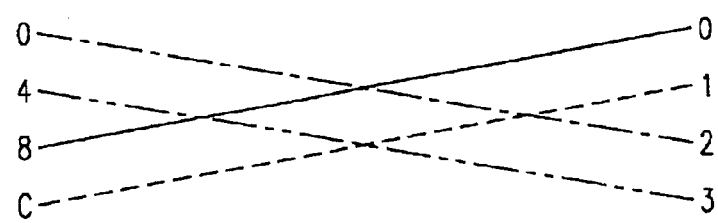
Figure 14D:
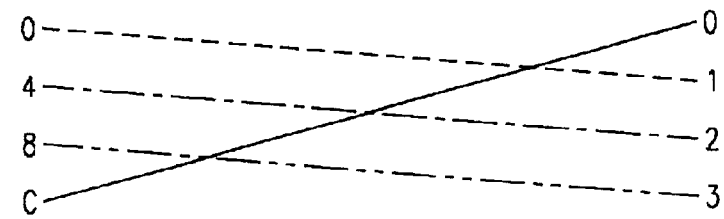

A flow chart describing the implementation of the B-Trellis 74 is given in FIG. 13. In FIGS. 14*a–d*, the four passes for the first group (destination states 0, 1, 2, 3) are separated for reference. The final path metrics for each destination state are:

$P(0,T_{n+1})$ equals min[$P(0,T_n)+B(0,0)$, $P(4,T_n)+B(4,0)$, $P(8,T_n)+B(8,0)$, $P(C,T_n)+B(C,0)$]

$P(1,T_{n+1})$ equals min[$P(4,T_n)+B(4,1)$, $P(8,T_n)+B(8,1)$, $P(C,T_n)+B(C,1)$, $P(0,T_n)+B(0,1)$]

$P(2,T_{n+1})$ equals min[$P(8,T_n)+B(8,2)$, $P(C,T_n)+B(C,2)$, $P(0,T_n)+B(0,2)$, $P(4,T_n)+B(4,2)$]

$P(3,T_{n+1})$ equals min[$P(C,T_n)+B(C,3)$, $P(0,T_n)+B(0,3)$, $P(4,T_n)+B(4,3)$, $P(8,T_n)+B(8,3)$]

In block 110, the indices are initialized in block 112, IR1 is loaded with a register 44 storing a set of previously calculated path metrics. For the first group of destination states (shown in FIGS. 14*a–d*), CMP(048C) is loaded into IR1. For the second, third and fourth groups of destination states, CMP(159D), CMP(26AE) and CMP(37BF), respectively, will be loaded.

In block 114, the appropriate branch metrics are loaded into respective fields of input register IR2. On the first pass (C=0), the four fields are set to $B(r,q)|B(r+4,q+1)|B(r+8,q+2)|B(r+C,q+3)$. On the second pass, the four fields are set to $B(r+4,q)|B(r+8,q+1)|B(r+C,q+2)|B(r,q+3)$. On the third pass, the four fields are set to $B(r+8,q)|B(r+C,q+1)|B(r,q+2)|B(r+4,q+3)$. On the fourth pass, the four fields are set to $B(r+C,q)|B(r,q+1)|B(r+4,q+2)|B(r+8,q+3)$.

In block 116, the multi-field addition is performed, rendering one candidate path metric for each of the four destination states, which is stored in a TMP register. In block 118 and 120, fields in IR1 are rotated on each pass. The reason for rotating the fields is that each of the input states are used in a candidate path metric calculation over four passes. Thus, for example, source state 0 ($T_n$) is used for a path metric calculation for destination state 0 in the first pass, for destination state 1 in the second pass, destination state 2 in the third pass and destination state 3 in the fourth pass. The rotation aligns the source state with the proper field for the multi-field add operation (see Tables 5–8, below).

TABLE 5

Content of TMP Registers After First Group

|  | State 0 | State 1 | State 2 | State 3 |
|---|---|---|---|---|
| TMP(0) | $P(0,T_n)$ + $B(0,0)$ | $P(4,T_n)$ + $B(4,1)$ | $P(8,T_n)$ + $B(8,2)$ | $P(C,T_n)$ + $B(C,3)$ |
| TMP(1) | $P(4,T_n)$ + $B(4,0)$ | $P(8,T_n)$ + $B(8,1)$ | $P(C,T_n)$ + $B(C,2)$ | $P(0,T_n)$ + $B(0,3)$ |
| TMP(2) | $P(8,T_n)$ + $B(8,0)$ | $P(C,T_n)$ + $B(C,1)$ | $P(0,T_n)$ + $B(0,2)$ | $P(4,T_n)$ + $B(4,3)$ |
| TMP(3) | $P(C,T_n)$ + $B(C,0)$ | $P(0,T_n)$ + $B(0,1)$ | $P(4,T_n)$ + $B(4,2)$ | $P(8,T_n)$ + $B(8,3)$ |

TABLE 6

Content of TMP Registers After Second Group

|  | State 4 | State 5 | State 6 | State 7 |
|---|---|---|---|---|
| TMP(0) | $P(1,T_n)$ + $B(1,4)$ | $P(5,T_n)$ + $B(5,5)$ | $P(9,T_n)$ + $B(9,6)$ | $P(D,T_n)$ + $B(D,7)$ |
| TMP(1) | $P(5,T_n)$ + $B(5,4)$ | $P(9,T_n)$ + $B(9,5)$ | $P(D,T_n)$ + $B(D,6)$ | $P(1,T_n)$ + $B(1,7)$ |
| TMP(2) | $P(9,T_n)$ + $B(9,4)$ | $P(D,T_n)$ + $B(D,5)$ | $P(1,T_n)$ + $B(1,6)$ | $P(5,T_n)$ + $B(5,7)$ |
| TMP(3) | $P(D,T_n)$ + $B(D,4)$ | $P(1,T_n)$ + $B(1,5)$ | $P(5,T_n)$ + $B(5,6)$ | $P(9,T_n)$ + $B(9,7)$ |

TABLE 7

Content of TMP Registers After Third Group

|  | State 8 | State 9 | State A | State B |
|---|---|---|---|---|
| TMP(0) | $P(2,T_n)$ + $B(2,8)$ | $P(6,T_n)$ + $B(6,8)$ | $P(A,T_n)$ + $B(A,A)$ | $P(E,T_n)$ + $B(E,B)$ |
| TMP(1) | $P(6,T_n)$ + $B(6,8)$ | $P(A,T_n)$ + $B(A,8)$ | $P(E,T_n)$ + $B(E,A)$ | $P(2,T_n)$ + $B(2,B)$ |
| TMP(2) | $P(A,T_n)$ + $B(A,8)$ | $P(E,T_n)$ + $B(E,8)$ | $P(2,T_n)$ + $B(2,A)$ | $P(6,T_n)$ + $B(6,B)$ |
| TMP(3) | $P(E,T_n)$ + $B(E,8)$ | $P(2,T_n)$ + $B(2,8)$ | $P(6,T_n)$ + $B(6,A)$ | $P(A,T_n)$ + $B(A,B)$ |

TABLE 8

Content of TMP Registers After Fourth Group

|        | State C              | State D              | State E              | State F              |
|--------|----------------------|----------------------|----------------------|----------------------|
| TMP(0) | P(3,$T_n$) + B(3,C)  | P(7,$T_n$) + B(7,D)  | P(B,$T_n$) + B(B,E)  | P(F,$T_n$) + B(F,F)  |
| TMP(1) | P(7,$T_n$) + B(7,C)  | P(B,$T_n$) + B(B,D)  | P(F,$T_n$) + B(F,E)  | P(3,$T_n$) + B(3,F)  |
| TMP(2) | P(B,$T_n$) + B(B,C)  | P(F,$T_n$) + B(F,D)  | P(3,$T_n$) + B(3,E)  | P(7,$T_n$) + B(7,F)  |
| TMP(3) | P(F,$T_n$) + B(F,C)  | P(3,$T_n$) + B(3,D)  | P(7,$T_n$) + B(7,E)  | P(B,$T_n$) + B(B,F)  |

After the four passes are complete, the compare operations of blocks 122, 124 and 126 are implemented, similar to those shown in blocks 92–96 of FIG. 12. In block 122, the respective fields of TMP(0) and TMP(1) are compared and the paths with the lowest path metric for each field are selected and stored back in TMP(0). In block 124, the respective fields of TMP(2) and TMP(3) are compared and the paths with the lowest path metric for each field are selected and stored in TMP(1). Finally, in block 126, TMP(0) and TMP(1) are compared and the lowest path metric for each field is stored in the appropriate register associate with the states being evaluated. For the A-Trellis of FIG. 10a, this would be CMP(0123).

After the selection of the lowest path metric for each of the destination states in the group, the next group is selected by blocks 128 and 130, until all the path metrics are complete. The path metrics computed by the B-trellis are used by the next A-trellis for computation of the next set of path metrics.

The present invention provides significant advantages over the prior art. By rearranging the trellises, multi-field additions and comparisons can be used to greatly speed the computations of the Viterbi decoder, thereby allowing a software decoder to be implemented.

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the Claims.

What is claimed is:

1. A method of performing Viterbi decoding function comprising the steps of:
    calculating candidate path metrics for states at time $T_n$ based on previously calculated path metrics for states at time $T_{n-1}$ and branch metrics associated with transitions between said states at time $T_{n-1}$ and states at time $T_n$ according to a first trellis;
    selecting path metrics for states at time $T_n$ from said candidate path metrics;
    calculating candidate path metrics for states at $T_{n+1}$ based on said selected path metrics for states at $T_n$ according to a second trellis, different from said first trellis.

2. The method of claim 1 wherein said step of calculating candidate path metrics according to a first trellis comprises the step of simultaneously calculating path metrics for a group of states at $T_n$.

3. The method of claim 2 and further comprising the step of repeating said step of calculating path metrics for a group of states at $T_n$ until path metric candidates for all states at $T_n$ are generated.

4. The method of claim 2 wherein said step of simultaneously calculating path metrics for a group comprises the steps of:
    for each of j sets of states at $T_{n-1}$, loading fields associated with a first operand of a processing device with respective path metrics of the set, loading a second operand of said processing device with corresponding branch metrics, adding said first and second operands to generate a result providing candidate path metrics for said group of states at $T_n$ in respective fields of the result.

5. The method of claim 4 and further comprising the step of storing the result for each of said j sets in respective registers.

6. The method of claim 5 wherein said selecting step comprises the step of comparing respective fields of said registers to determine a smallest path metric for each state of said group.

7. The method of claim 6 and further comprising the step of updating a traceback array.

8. The method of claim 1 wherein said step of calculating candidate path metrics according to a second trellis comprises the step of simultaneously calculating path metrics for a group of states at $T_{n+1}$.

9. The method of claim 8 and further comprising the step of repeating said step of calculating path metrics for a group of states at $T_n$ until path metric candidates for all states at $T_{n+1}$ are generated.

10. The method of claim 8 wherein said step of simultaneously calculating path metrics for a group of states at $T_{n+1}$ comprises the steps of:
    loading fields associated with a first operand of a processing device with respective path metrics of a set of states at $T_n$, loading respective fields of a second operand of said processing device with corresponding branch metrics, adding said first and second operands to generate a result providing candidate path metrics for said group of states at $T_{n+1}$ in respective fields of the result.

11. The method of claim 10 and further comprising the step of generating additional candidate path metrics for said group of states at $T_{n+1}$ by rotating the fields in said first operand, loading respective fields of the second operand with corresponding state metrics and adding said first and second operands.

12. A Viterbi decoder comprising:
    programmable processing circuitry for:
        calculating candidate path metrics for states at time $T_n$ based on previously calculated path metrics for states at time $T_{n-1}$ and branch metrics associated with transitions between said states at time $T_{n-1}$ and states at time $T_n$ according to a first trellis;
        selecting path metrics for states at time $T_n$ from said candidate path metrics;
        calculating candidate path metrics for states at $T_{n+1}$ based on said selected path metrics for states at $T_n$ according to a second trellis, different from said first trellis.

13. The Viterbi decoder of claim 12 wherein said programmable processing circuitry calculates candidate path metrics according to a first trellis by simultaneously calculating path metrics for a group of states at $T_n$.

14. The Viterbi decoder of claim 13 wherein said programmable processing circuitry repeats the calculation of path metrics for a group of states at $T_n$ until path metric candidates for all states at $T_n$ are generated.

15. The Viterbi decoder of claim 13 wherein said programmable processing circuitry includes a arithmetic unit operable to perform multiple simultaneous logic operations on respective fields of first and second operands.

16. The Viterbi decoder of claim 15 wherein path metrics for a group are calculated by:

for each of j sets of states at $T_{n-1}$, loading fields associated with the first operand with respective path metrics of the set, loading the second operand of with corresponding branch metrics, adding said first and second operands to generate a result providing candidate path metrics for said group of states at $T_n$ in respective fields of the result.

17. The Viterbi decoder of claim 16 wherein said programmable processing circuitry includes respective registers for storing the result for each of said j sets.

18. The Viterbi decoder of claim 17 wherein programmable processing circuitry selects path metrics by comparing respective fields of said registers to determine a smallest path metric for each state of said group.

19. The Viterbi decoder of claim 18 wherein said programmable processing circuitry stores said smallest path metrics in a traceback array.

20. The Viterbi decoder of claim 12 wherein said programmable processing circuitry calculates candidate path metrics according to a second trellis by simultaneously calculating path metrics for a group of states at $T_{n+1}$.

21. The Viterbi decoder of claim 20 wherein said programmable processing circuitry repeats calculating path metrics for a group of states at $T_n$ until path metric candidates for all states at $T_{n+1}$ are generated.

22. The Viterbi decoder of claim 21 wherein said programmable processing circuitry includes a arithmetic unit operable to perform multiple simultaneous logic operations on respective fields of first and second operands.

23. The Viterbi decoder of claim 20 wherein said programmable processing circuitry calculates path metrics for a group of states at $T_{n+1}$ by loading fields associated with the first operand of a processing device with respective path metrics of a set of states at $T_n$, loading respective fields of the second operand of said processing device with corresponding branch metrics, and adding said first and second operands to generate a result providing candidate path metrics for said group of states at $T_{n+1}$ in respective fields of the result.

24. The Viterbi decoder of claim 23 wherein said programmable processing device generates additional candidate path metrics for said group of states at $T_{n+1}$ by rotating the fields in said first operand, loading respective fields of the second operand with corresponding state metrics and adding said first and second operands.

* * * * *